United States Patent
Li et al.

(10) Patent No.: US 10,761,172 B2
(45) Date of Patent: Sep. 1, 2020

(54) SYSTEM AND METHOD FOR AN EDDY-CURRENT FIELD COMPENSATION IN MAGNETIC RESONANCE IMAGING

(71) Applicant: SHANGHAI UNITED IMAGING HEALTHCARE CO., LTD., Shanghai (CN)

(72) Inventors: Bo Li, Shanghai (CN); Erwei Jia, Shanghai (CN); Xiaocong Xing, Shanghai (CN); Kaipin Xu, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 16/564,702

(22) Filed: Sep. 9, 2019

(65) Prior Publication Data
US 2020/0064429 A1 Feb. 27, 2020

Related U.S. Application Data

(63) Continuation of application No. 15/322,375, filed as application No. PCT/CN2016/085132 on Jun. 7, 2016, now Pat. No. 10,408,908.

(30) Foreign Application Priority Data
Aug. 25, 2015 (CN) .......................... 2015 1 0527333

(51) Int. Cl.
*G01R 33/565* (2006.01)
*G01R 33/00* (2006.01)
*G01R 33/56* (2006.01)

(52) U.S. Cl.
CPC ... *G01R 33/56518* (2013.01); *G01R 33/0017* (2013.01); *G01R 33/0064* (2013.01); *G01R 33/0082* (2013.01); *G01R 33/5608* (2013.01)

(58) Field of Classification Search
CPC .......... G01R 33/56518; G01R 33/0017; G01R 33/0064; G01R 33/0082
See application file for complete search history.

(56) References Cited

U.S. PATENT DOCUMENTS

| 4,965,521 A | 10/1990 | Egloff |
| 5,488,299 A | 1/1996 | Kondo et al. |

(Continued)

FOREIGN PATENT DOCUMENTS

| CN | 102103196 A | 6/2011 |
| CN | 102298129 A | 12/2011 |
| CN | 104181479 A | 12/2014 |

OTHER PUBLICATIONS

International Search Report for PCT/CN2016/085132 dated Aug. 29, 2016, 5 pages.

(Continued)

*Primary Examiner* — Gregory H Curran
(74) *Attorney, Agent, or Firm* — Metis IP LLC

(57) ABSTRACT

A system and method for acquiring a calibrated eddy-current field model in magnetic resonance imaging (MM) are provided. The method may include one or more of the following operations. An eddy-current field model may be obtained. The eddy-current field model may be transformed by Laplace Transformation. Data of an eddy-current field may be obtained. The data of the eddy-current field may be processed. A calibrated eddy-current field model may be acquired. In addition, the calibrated eddy-current field model may be used to compensate an eddy-current field.

20 Claims, 10 Drawing Sheets

(56) References Cited

U.S. PATENT DOCUMENTS

| | | | |
|---|---|---|---|
| 6,427,079 | B1 | 7/2002 | Schneider et al. |
| 7,002,343 | B2 | 2/2006 | Weissenberger |
| 7,372,266 | B2 | 5/2008 | Markl et al. |
| 9,191,582 | B1 | 11/2015 | Wright et al. |
| 2004/0227513 | A1 | 11/2004 | Weissenberger |
| 2012/0229139 | A1 | 9/2012 | Yamanaka |
| 2012/0271583 | A1 | 10/2012 | Xu et al. |
| 2013/0285653 | A1 | 10/2013 | Zhou |
| 2014/0125333 | A1 | 5/2014 | Hanada et al. |

OTHER PUBLICATIONS

Lustig M, et al., Sparse MRI: The Application of Compressed Sensing for Rapid MR Imaging, journal. Magnetic Resonance in Medicine, 58(6): 1182-95, 2007.

Press W H et al., Numerical Recipes in C: The Art of Scientific Computing, Cambridge University Press, Cambridge, pp. 394-444, 656-681, 1992.

Xu, Kaipin et al., Research on Some Numerical Approaches Applied to Cheinometric Analysis of NMR Spectroscopy Data. Chinese Doctoral Dissertations Full-text database Engineering Science and Technology I, No. 12, Dec. 15, p. 5, 14, 70 and 72, 2014.

Matt A. Bernstein et al., Handbook of MRI Pulse Sequences. Elsevier Academic Press, pp. 316-331, 2004.

Written Opinion in PCT/CN2016/065132 dated Aug. 29. 2016, 5 pages.

P Jehenson et al., Analytical method for the Compensation of eddy-current effects included by Pulsed Magnetic Field Gradients in NMR systems. Journal of Magnetic Resonance, 90(2): 264-278, 1990.

R Zorgati et al., Eddy Current Testing of Anomalies in Conductive Materials, Part I: Qualitative Imaging via Diffraction Tomography Techniques. IEEE Transactions on Magnetics, 27(6), 4416-4437, 1991.

P D Ledger et al., hp-Finite element discretisation of the electrical impedance tomography problem, Computer Methods in Applied Mechanics and Engineering, 225:154-176, 2012.

Sun B et al., A Study Based on Real-time Data Acquisition System of intelligent Seismometers in Two Dimension Seismic Prospecting. Machatronics and Automation (ICMA), 2012 International Conference on, IEEE, 2400-2404, 2012.

B A Auld et al., Review of Advances in Quantitative Eddy Current ondestructive Evaluation. Journal of Nondestructive Evaluation, 18(1), 3-36, 1999.

Takahashi K et al., Nonlinear Sensorless Cooling Control for a Peltier Actuated Aluminum Plate Thermal System. Proceedings of the 2013 International Conference on Advanced Mechatronic Systems, IEEE, 1-715, 2013.

Extended European Search Report for European Application No. 16838392.5 dated Aug. 8, 2018, 19 pages.

SYSTEM AND METHOD FOR AN EDDY-CURRENT FIELD COMPENSATION IN MAGNETIC RESONANCE IMAGING

CROSS-REFERENCE TO RELATED APPLICATIONS

This application is a continuation of U.S. application Ser. No. 15/322,375 filed on Dec. 27, 2016, which is a U.S. national stage under 35 U.S.C. § 371 of international Application No. PCT/CN2016/085132, filed on Jun. 7, 2016 and claims priority of Chinese Application No. 201510527333.4 filed on Aug. 25, 2015, the entire contents of which are incorporated herein by reference.

TECHNICAL FIELD

The present disclosure generally relates to magnetic resonance imaging (MRI), and more particularly, to a system and method for an eddy-current field compensation in magnetic resonance imaging.

BACKGROUND

A magnetic resonance imaging (MRI) system may be used to diagnose medical conditions by exploiting a powerful magnetic field and radio frequency (RF) techniques. During the process of magnetic resonance imaging (MRI), current in one or more gradient coils may change time, thus induces eddy-current around the conducting structures. The eddy-current may cause a field varying spatially and/or temporally, and may result in a distortion of the gradient magnetic field within the imaging region and/or degradation of the quality of the MRI image.

In order to compensate for the effects of the eddy-current, additional coils may be used as self-shielding coils for generating a counter gradient magnetic field. The counter gradient magnetic field may reduce the interaction between coils and magnet to restrain eddy-current. However, residual eddy-current may remain.

SUMMARY

In a first aspect of the present disclosure, a magnetic resonance imaging (MM) system is provided. In some embodiments, the MM system may include an MRI scanner and a device. The device may include a processor and a computer-readable storage medium. The computer-readable storage medium may store a computer program having instructions. The instructions, when executed by the processor, may cause the processor to perform operations. The processor may obtain an eddy-current field model. The eddy-current field model may be transformed by Laplace Transformation. Data of an eddy-current field may be obtained. The data of the eddy-current field may be processed based on the eddy-current field model to obtain a first parameter. A second parameter may be acquired by fitting the eddy-current field model based on the data and the first parameter. A calibrated eddy-current field model may be acquired based on the second parameter.

In a second aspect of the present disclosure, a method is provided. The method may include one or more of the following operations. An eddy-current field model may be obtained. The eddy-current field model may be transformed by Laplace Transformation. Data of a first eddy-current field may be obtained. The data of the first eddy-current field based on the eddy-current field model may be processed to obtain a first parameter. A second parameter may be acquired by fitting the eddy-current field model with the data and the first parameter. A calibrated eddy-current field model based on the second parameter may be acquired.

In some embodiments, the eddy-current field may be compensated based on the calibrated eddy-current field model.

In some embodiments, the data of the eddy-current field may be processed using inverse Laplace transformation (ILT) to obtain a Laplacian spectrum. A peak of the Laplacian spectrum may be identified. Information of the peak may be acquired. The first parameter may be determined based on the information of the peak.

In some embodiments, the first parameter may be an initial parameter relating to the eddy-current field model.

In some embodiments, the Laplacian spectrum may include a sparse Laplacian spectrum or a smooth Laplacian spectrum.

In some embodiments, the information of the peak may include at least one type of position, boundary, or intensity.

In some embodiments, the peak may include a reliable spectrum peak.

In some embodiments, a first threshold may be obtained. The absolute value of intensity of the peak may be compared with the first threshold. The peak may be marked as a reliable spectrum peak if the absolute value of the intensity of the peak is equal to or exceeds the first threshold.

In some embodiments, the first parameter may be determined based on a corresponding parameter of the reliable spectrum peak.

In some embodiments, a boundary of the reliable spectrum peak may be determined. A total intensity of the reliable spectrum peak within the boundary may be calculated. The first parameter based on the total intensity of the reliable spectrum peak may be set.

In some embodiments, regularization may be applied to calculate the data of the eddy-current field based on inverse Laplace transformation (ILT).

In some embodiments, a nonlinear least square fitting may be applied.

In some embodiments, the nonlinear least square fitting may include one or more bilateral linear inequality constraints.

In some embodiments, the calibrated eddy-current field model may be acquired by performing a computer program stored in a non-transitory computer-readable storage medium.

In some embodiments, the computer program may have instructions that when executed by the processor, the processor may perform operations to acquire the calibrated eddy-current model.

In some embodiments, the calibrated eddy-current field model may be acquired by a magnetic resonance imaging (MRI) system including an MRI scanner, a processor, and instructions.

In some embodiments, when the instructions are executed by the processor, the processor may perform operations to acquire the calibrated eddy-current field model.

In some embodiments, at least one characteristic component of the eddy-current field may be identified based on the calibrated eddy-current field model and further used to compensate the eddy-current field.

In some embodiments, a plurality of characteristic components of the eddy-current field may be identified based on the calibrated eddy-current field model and further used to compensate the eddy-current field.

In some embodiments, a second eddy-current field including the plurality of characteristic components may be obtained and compensated based on the calibrated eddy-current field model.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

It will be understood that the term "system," "unit," "module," and/or "block" used herein are one method to distinguish different components, elements, parts, section or assembly of different level in ascending order. However, the terms may be displaced by other expression if they may achieve the same purpose.

It will be understood that when a unit, module or block is referred to as being "on," "connected to" or "coupled to" another unit, module, or block, it may be directly on, connected or coupled to the other unit, module, or block, or intervening unit, module, or block may be present, unless the context clearly indicates otherwise. As used herein, the term "and/or" includes any and all combinations of one or more of the associated listed items.

The terminology used herein is for the purposes of describing particular examples and embodiments only, and is not intended to be limiting. As used herein, the singular forms "a," "an" and "the" may be intended to include the plural forms as well, unless the context clearly indicates otherwise. It will be further understood that the terms "include," and/or "comprising," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof.

Figure 1:
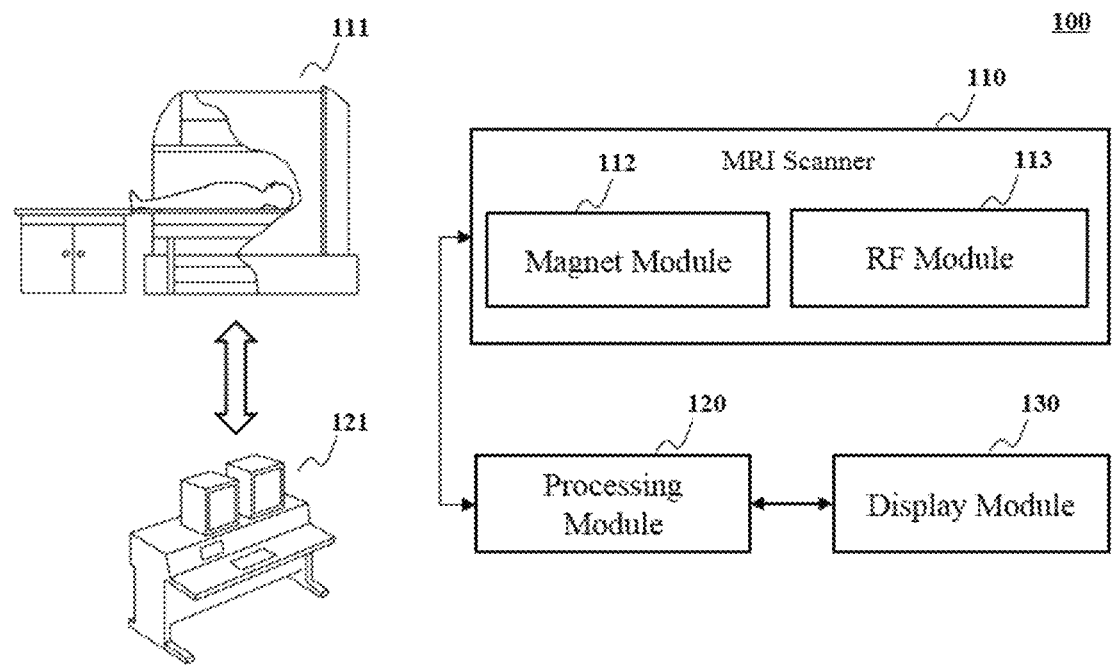
FIG. 1 illustrates a magnetic resonance imaging (MRI) system according to some embodiments of the present disclosure.

FIG. 1 illustrates a magnetic resonance imaging system according to some embodiments of the present disclosure. As illustrated, an MRI system 100 may include an MRI scanner 110, a processing module 120, and a display module 130. The MRI system's image include a main magnet 111, a processor and a computer-readable storage medium 121 are presented. The MRI scanner 110 may include a magnet module 112 and a radio frequency (RF) module 113. The magnet module 112 may include a main magnet filed generator and/or a plurality of gradient coils. The main magnet field generator may create a static magnetic field B0 during an MRI process. The main magnetic field generator may be of various types including, for example, a permanent magnet, a superconducting electromagnet, a resistive electromagnet, etc. The gradient coils may include X-gradient coils, Y-gradient coils, and Z-gradient coils. The gradient coils may generate magnetic field gradients to the main magnetic field in the X, Y, and/or Z directions to encode the spatial information of the subject located in the MRI scanner 110. In some embodiments, the X-gradient may provide the X-position information, which may be known as frequency encoding. In some embodiments, the Y-gradient may provide the Y-positon information, which may be known as phase encoding. The RF module 113 may include RF transmitting coils and/or receiving coils. These RF coils may transmit RF signals to or receive RF signals from a subject of interest. In some embodiments, the function, size, type, geometry, position, amount, and/or magnitude of the magnet unit 112 and/or of the RF unit 113 may be determined or changed according to one or more specific conditions. For example, according to the difference in function and size, the RF coils may be classified as volume coils and local coils. In some embodiments, the volume coils may include birdcage coils, transverse electromagnetic coils, surface coils, saddle coils, etc. In some embodiments, the local coils may include birdcage coils, solenoid coils, saddle coils, flexible coils, etc.

The processing module 120 may process different kinds of instructions received from different modules. For further understanding the present disclosure, several examples are given below, but the examples do not limit the scope of the present disclosure. For example, in some embodiments, the processing module 120 may process data of the gradient magnetic field received from the magnet module 112 and calculated one or more parameters based on these datum and fitting the eddy-current field model with the parameters. The display unit 130 may receive input and/or display output information. The input and/or output information may include programs, software, algorithms, data, text, number, images, voice, or the like, or any combination thereof. For example, a user or an operator may input some initial parameters or conditions to initiate a scan. As another example, some information may be imported from external resource, such as a floppy disk, a hard disk, a wireless terminal, or the like, or any combination thereof.

It should be noted that the above description of the MRI system 100 is merely provided for the purposes of illustration, and not intended to limit the scope of the present disclosure. For persons having ordinary skills in the art, multiple variations and modifications may be made under the teachings of the present disclosure. For example, the assembly and/or function of the MRI system 100 may be varied or changed according to specific implementation scenarios. Merely by way of example, some other components may be added into the MRI system 100, such as a patient positioning unit, a gradient amplifier unit, and other devices or units. Note that the MIll system may be a traditional or a single-modality medical system, or a multi-modality system including, e.g., a positron emission tomography-magnetic resonance imaging (PET-MRI) system, a computed tomography-magnetic resonance imaging (CT-MRI) system, a remote medical MRI system, and others, etc. However, those variations and modifications do not depart from the scope of the present disclosure.

Figure 2:
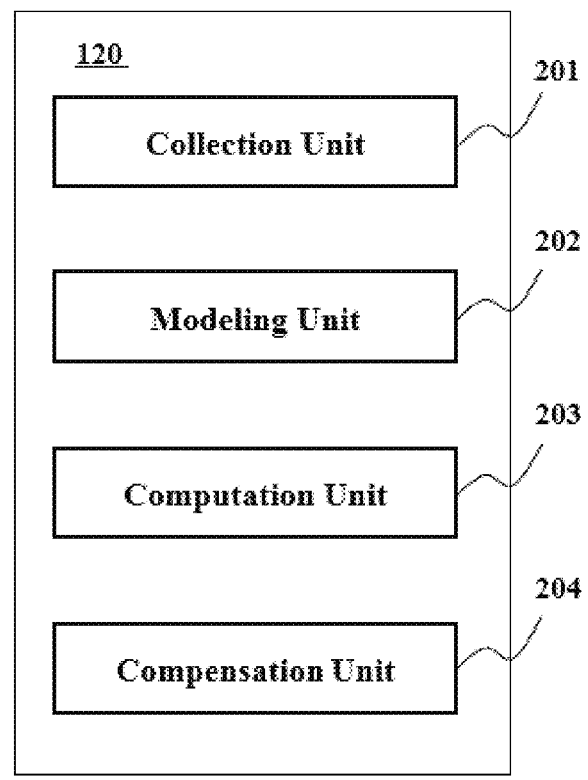
FIG. 2 is a block diagram illustrating the processing module according to some embodiments of the present disclosure.

FIG. 2 is a block diagram illustrating the processing module 120 according to some embodiments of the present disclosure. The processing module 120 as illustrated in FIG. 1 may process information before, during, or after an imaging procedure. Note that the construction of the processing module 120 may have some other variations, and that FIG. 2 is provided for illustration purposes. The processing module 120 may include a CPU. The CPU may be a central processing unit (CPU), an application-specific integrated circuit (ASIC), an application-specific instruction-set processor (ASIP), a graphics processing unit (GPU), a physics processing unit (PPU), a microcontroller unit, a digital signal processor (DSP), a field programmable gate array (FPGA), an ARM, or the like, or any combination thereof. As shown in FIG. 2, the processing module 120 may include a collection unit 201, a modeling unit 202, a computation unit 203 and a compensation unit 204.

The collection unit 201 may obtain different kinds of information. The information may include information about the MIll scanner 110, the magnet module 112, the RF module 113, or the like, or any combination thereof. In some embodiments, the information may be a subject position (e.g., within an MIll system), the main and/or gradient magnetic field intensity, the data of the eddy-current field (or referred to as the eddy-current field data), the radio frequency phase and/or amplitude, and so on. The information may include information from a user and/or other external resource. Exemplary information from a user may include the parameters regarding the parameters of the main and/or gradient magnetic field, a subject of interest (e.g., the type of tissue to be imaged, etc.), slice thickness, an imaging type, a spin echo type (e.g., spin echo, fast spin echo (FSE), fast recovery FSE, single shot FSE, gradient recalled echo, fast imaging with stead-state procession, and so on), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth, etc.), or the like, or any combination thereof. In some embodiments, the information may be an eddy-current field model, one or more parameters of the eddy-current field model including, e.g., one or more parameters for a model for a first-stage eddy-current field compensation based on prior experience, etc.

The modeling unit 202 may obtain a model of the eddy-current field. In some embodiments, the modeling unit 202 may obtain the eddy-current field model from a user and/or other external resource. Exemplary models may be a Multiple-index model, etc. In some embodiments, the modeling unit 202 may perform Laplace transformation on the eddy-current field model. In some embodiments, the modeling unit 202 may obtain the calibrated eddy-current field model based on the parameters from the computation unit 203. In some embodiments, the modeling unit 202 may obtain a calibrated eddy-current field model based on optimized parameters from the computation unit 203.

The computation unit 203 may calculate different kinds of information. In some embodiments, the computation unit 203 may calculate the data of the eddy-current field to obtain the parameters of an eddy-current field model. In some embodiments, the computation unit 203 may further perform curve-fitting based on the eddy-current field model and the data of the eddy-current field to obtain the calibrated eddy-current field model. In some embodiments, the computation unit 203 may transform the data of the eddy-current field using inverse Laplace transformation (ILT) to obtain a Laplacian spectrum. In some embodiments, the computation unit 203 may identify a peak of the Laplacian spectrum. In some embodiments, the computation unit 203 may compare the absolute value of intensity of the peak with a first threshold. In some embodiments, the computation unit 203 may identify a reliable spectrum peak, if the absolute value of intensity of which is not less than the first threshold. In some embodiments, the computation unit 203 may determine a boundary of the reliable spectrum peak. In some embodiments, the computation unit 203 may calculate a total intensity of the reliable spectrum peak within the boundary. In some embodiments, the computation unit 203 may apply regularization to calculate the data of the eddy-current field based on inverse Laplace transformation (ILT). In some embodiments, the computation unit 203 may apply a nonlinear least square fitting. In some embodiments, the computation unit 203 may apply bilateral linear inequality constraints.

The compensation unit 204 may compensate an eddy-current field. In some embodiments, the compensation unit 204 may compensate the eddy-current based on an empirical value from a user and/or another external resource. In some embodiments, the compensation unit 204 may compensate the eddy-current field based on the calibrated eddy-current field model. In some embodiments, the compensation unit 204 may compensate the eddy-current field based on the gradient magnetic field.

It should be noted that the above description of the MRI system is merely provided for the purposes of illustration, and not intended to limit the scope of the present disclosure. For persons having ordinary skills in the art, multiple variations and modifications may be made under the teaching of the present invention. For example, the assembly and/or function of processing module may be varied or changed. However, those variations and modifications do not depart from the scope of the present disclosure.

Figure 3:
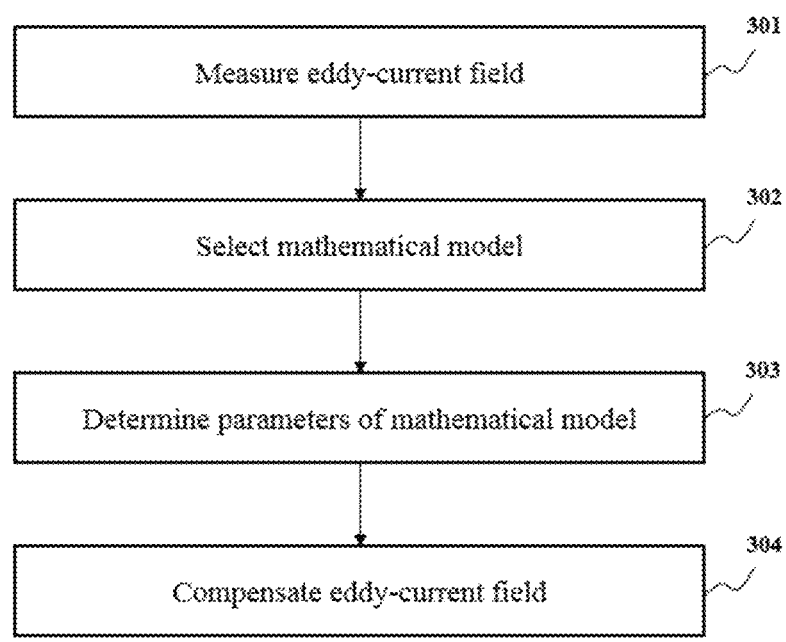
FIG. 3 is a flowchart illustrating a process for eddy-current field compensation according to some embodiments of the present disclosure.

FIG. 3 is a flowchart illustrating a process for eddy-current field compensation according to some embodiments of the present disclosure. Eddy-current field data may be acquired in step 301. In some embodiments, the eddy-current field data may be acquired by taking a measurement when the MRI scanner operates. In different operational situations, different gradient magnetic fields may be desired, and different eddy-current fields may be generated according to the operation parameters. Different eddy-current field data may be categorized into several groups corresponding to their operational parameters. Exemplar operational parameters may include current intensity, duration time, or the like, or a combination thereof. Additionally or alternatively, eddy-current field data may be different under the same operational parameters due to differences in, for example, material(s) of one or more magnetic conductive components, the configuration of gradient coils, or the like, or a combination thereof. For example, in the magnet module 112, the length of a magnetic conductive component may be longer than another in a different Mill scanner. As another example, the gaps of the magnetic conductive components in an Mill scanner may be different from those in another Mill scanner. In some embodiments, the eddy-current field data may also be set by default. For example, in a simulation experiment, the eddy-current field data may be set by a user according to prior experience.

In step 302, a mathematical model may be selected. The number of the selected mathematical models may be one, or two, or any positive integer. The mathematical models may be stored in a mathematical model database. In some embodiments, the mathematical model database may be stored on a local device, for example, in the processing module 120 or a storage medium of the magnetic resonance imaging system. In some embodiments, the mathematical model database may be stored in a server (e.g., a cloud server) (not shown in the drawings).

A mathematical model may include or be based on an exponential function, a multi-exponential function, an attenuation model, or the like, or a combination thereof. For different MRI scanners, a same mathematical model or different mathematical models may be selected. Different Mill scanners may include MRI scanners of different designs, by different manufacturers, etc. Merely by way of example, two MRI scanners of a same design by a same manufacture, when operating according to same operational parameters may generate different eddy-current fields; a same mathematical model or different mathematical models may be selected. As another example, a same mathematical model may be used in connection with multiple MRI scanners of a same design or different designs, by a same manufacturer or different manufacturers, etc. The selected mathematical model may contain one or more unknown parameters, which may be determined in subsequent steps. Otherwise, if the selected mathematical model does not contain unknown parameters, it may be used in the compensation for eddy-current field.

In step 303, unknown parameters of the selected mathematical model may be determined according to the eddy-current field data of an MRI acquired previously. The calculation may be performed in the computation unit 203. In some embodiments of the present disclosure, the determination may be based on all or part of the eddy-current field data. In some embodiments, the determination may be optimized based on one or more characteristics of the eddy-current field data. The optimization may include improvements in terms of the time that it may take to determine one or more unknown parameters of the selected mathematical model, the result of the compensation, or the like, or a combination thereof. In some embodiments, the unknown parameter(s) of the selected mathematical model may be determined based on the eddy-current field data and some other parameters of the MRI scanner. For example, the RF coil(s) or some other components in the Mill scanner may affect the gradient magnetic field. The parameters of an RF coil or some other components may be taken into consideration during calculation. As used herein, a mathematical model in combination with determined parameter(s) may be referred to as a calibrated mathematical model. A calibrated mathematical model may provide guidance for eddy-current field compensation. As used herein, a mathematical model for eddy-current field compensation may be referred to as a compensation model. As used herein, a calibrated mathematical model for eddy-current field compensation may be referred to as a calibrated compensation model. In some embodiments, because the unknown parameter(s) of the mathematic model are determined using data relating to a specific MRI scanner, the corresponding calibrated mathematical model may be used for eddy-current field compensation for the specific MRI scanner. Different eddy-current fields may be generated in a specific Mill scanner under different operation conditions. For instance, the ratio of the zero-order and/or the first-order eddy-currents to higher order eddy-currents may be changed with the changing of operation conditions. A calibrated mathematical model may be determined according to the kind of eddy-current field generated in the gradient magnetic field. Different calibrated mathematical models may be determined according to different eddy-current fields generated in the gradient magnetic field. One or more calibrated mathematical models may be stored locally and retrieved when needed.

In step 304, the eddy-current field in the gradient magnetic field may be compensated. The calibrated mathematical model may be retrieved for a specific Mill scan with a set of operational parameters using an MRI scanner. The computation unit 203 may calculate a simulated eddy-current field based on the calibrated mathematical model. The calculation of the simulated eddy-current field may also be based on at least some of the operational parameters. The simulated eddy-current field may be an approximation of an eddy-current generated in an MRI scan. The simulated eddy-current field may be then transformed into a control signal and/or further transferred into compensation hardware. Exemplary compensation hardware may include a digital filter, etc. The compensation hardware may generate a compensation eddy-current field that is opposite to the simulated one. The actual eddy-current field generated by the gradient coils of the MRI scanner may be compensated or cancelled out by the compensation eddy-current field.

It should be noted that FIG. 3 is for illustration purposes, not intended to limit the scope of the present disclosure. For example, the step 302 may be performed before step 301. In some embodiments, a mathematical model may be selected such that data related to an eddy-current field may be acquired according to the selected mathematical model for further processing.

Figure 4:
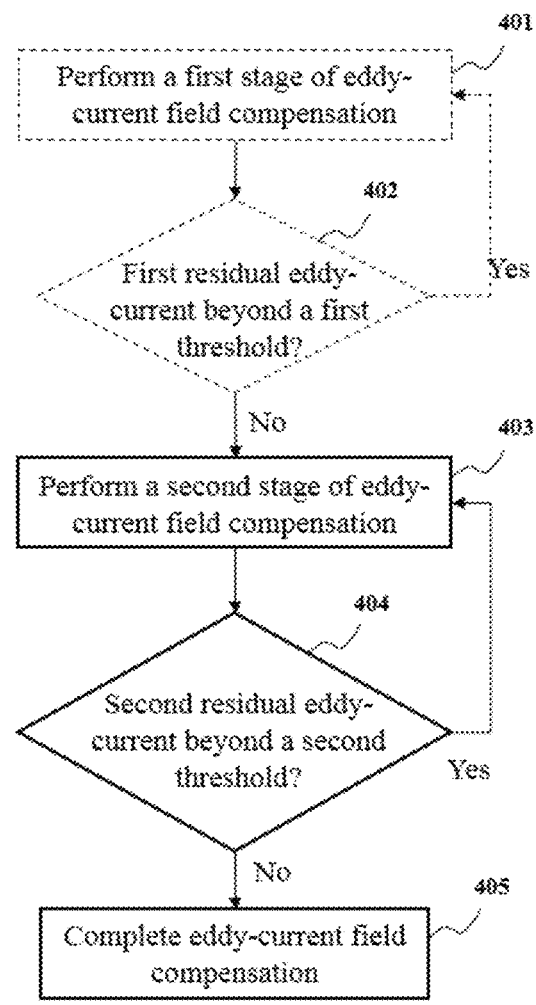
FIG. 4 is a flowchart illustrating a process for eddy-current field compensation according to some embodiments of the present disclosure.

FIG. 4 is a flowchart illustrating a process for eddy-current field compensation according to some embodiments of the present disclosure. The compensation may be separated into two stages. The first stage may be a coarse compensation; the second stage may be an accurate compensation. A coarse compensation of the eddy-current field in a gradient magnetic field may be achieved using a self-shielding coil surrounding a gradient coil. The current direction in the self-shielding coil may be opposite to the gradient coil. Parameters of the self-shielding coil may be adjusted to improve the eddy-current field compensation. Exemplary adjustable parameters of the self-shielding coil may include the length of the self-shielding coil, the perimeter of the self-shielding coil, the current intensity applied through the self-shielding coil, or the like, or a combination thereof. As another example, coarse compensation may be achieved using an eddy-current-resisting board made of a high electrical resistivity material. Parameters of the eddy-current-resisting board may be adjusted to improve the eddy-current field compensation. Exemplary adjustable parameters of the eddy-current-resisting board may include a geometry size of the eddy-current-resisting board, the position of the eddy-current resisting board relative to the gradient coil, the patterns of groove on the surface of the eddy-current resisting board, or the like, or a combination thereof. In step 401, a coarse compensation may be executed. At least a part of the eddy-current field may be compensated or cancelled out. However, residual eddy-current may still exist.

In step 402, an assessment may be performed to determine whether the coarse compensation satisfies a criterion. After the coarse compensation in step 401, the residual eddy-current after the first stage eddy-current field compensation (or referred to as "first residual eddy-current" as illustrated in FIG. 4) may be measured. If the first residual eddy-current exceeds a threshold ("first threshold" as illustrated in FIG. 4), the coarse compensation may be considered insufficient. Insufficient coarse compensation may cause more computational costs in a second stage compensation. The first threshold may be determined based on, for example, prior experience, the capacity and/or costs (e.g., computational costs, etc.) of the second stage compensation, or the like, or a combination thereof.

For example, according to prior experience, a certain amount of residual eddy-current may be acceptable, and a resultant MRI image may be sufficient for diagnosis purposes. As another example, a certain amount of residual eddy-current is within the compensation capacity of the second stage compensation so that the residual eddy-current may be compensated in the second stage compensation and a resultant image may be acceptable or sufficient for diagnosis purposes. As a further example, the cost (e.g., computational cost, etc.) of compensating a certain amount of residual eddy-current may be acceptable. The threshold may be set based on such an amount of residual eddy-current described above.

Based on the assessment, if the first residual eddy-current is beyond the threshold (e.g., "first threshold" as illustrated in FIG. 4), the process may proceed to step 401 to adjust the coarse compensation. If the first residual eddy-current is below the first threshold, a second stage compensation may be performed. The second stage compensation may be an accurate compensation.

In step 403, a second stage eddy-current field compensation may be performed. A mathematical model may be determined in this step and further used to compensate the eddy-current field. Exemplary methods of determining a mathematical model and/or compensating the eddy-current field according to the mathematical model may be disclosed elsewhere in the present disclosure (e.g., that illustrated in FIG. 5). At the second stage compensation, the eddy-current field may be further compensated. In step 404, the performance of the second stage compensation may be assessed. A measurement may be performed to collect the information about the residual eddy-current that remains after the second stage compensation. In some embodiments of the present disclosure, when a residual eddy-current after the second stage eddy-current field compensation (or referred to as "second residual eddy-current" as illustrated in FIG. 4) exceeds a threshold (e.g., "second threshold" as illustrated in FIG. 4), the process may proceed to step 403 to perform further second stage eddy-current field compensation in a different way. For example, a new mathematical model or a previously determined mathematical model may be used. In some embodiments, the parameters of the previously determined mathematical model may be adjusted or revised. If the second residual eddy-current is below the second threshold, the process may proceed to step 405 indicating that the eddy current compensation may be considered sufficient. The first threshold may be different from the second threshold.

It should be noted that the process illustrated in FIG. 4 is for illustration purposes, and not intended to limit the scope of the present disclosure. Merely by way of example, the coarse compensation step 401 and/or the corresponding assessment step 402 may be omitted. As another example, when the first stage compensation is performed, the assessment step 402 may be omitted. For example, a self-shielding coil and its parameters may be determined based on prior experience. The assessment step may be executed for several rounds of experiments and a standard parameters of a self-shielding coil may be determined. In the first stage compensation, the performance of compensation result may be assumed to be acceptable and need no test. Similar to step 402, the assessment of step 404 may be omitted. For example, if the compensation model determined in step 403 is sufficient based on numerous times of experiments, or the deviation of an MRI image caused by residual eddy-current is not obvious when applying said compensation model, the performance of compensation result may be assume to be acceptable, and the assessment in step 404 may be omitted.

Figure 5:
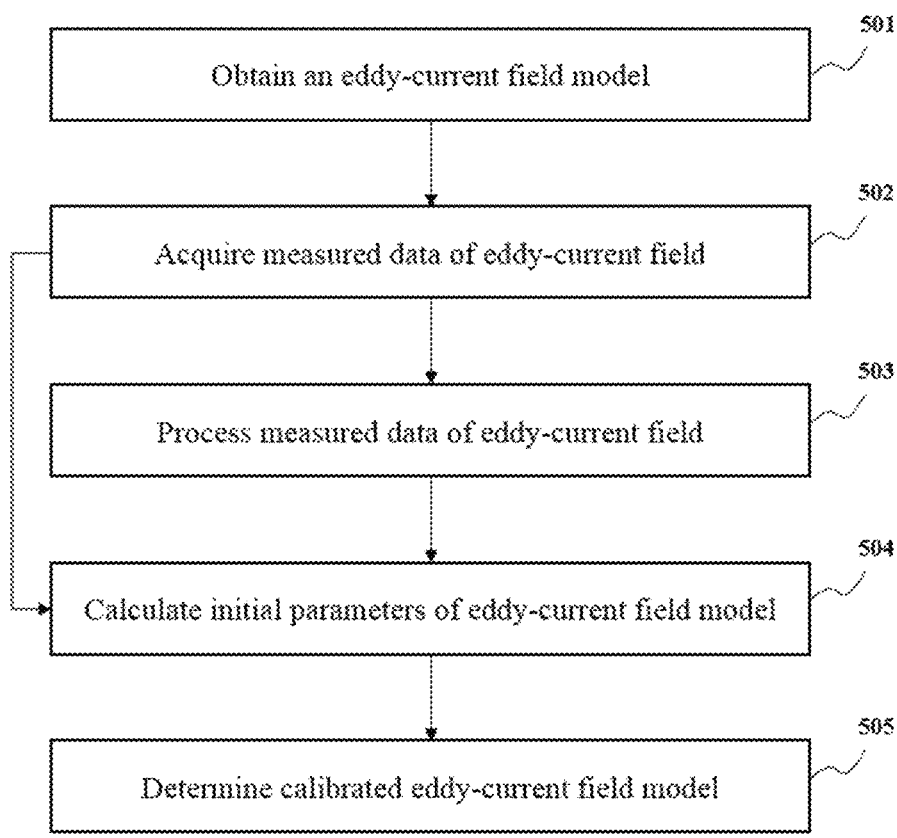
FIG. 5 is a flowchart illustrating a process for acquiring an eddy-current field compensation model according to some embodiments of the present disclosure.

FIG. 5 is a flowchart illustrating a process for acquiring an eddy-current field compensate model according to some embodiments of the present disclosure. In step 501, an eddy-current field model may be obtained. Merely by way of example, according to estimation or one or more prior eddy-current measurements, an eddy-current field may be approximated as a superposition of several exponential attenuation curves. Accordingly, an exemplary mathematical model may be a multi-exponential attenuation model. The eddy-current field model may include a mathematical model of this or other forms. The eddy-current field may be described using an eddy-current field model according to the mathematical model and information regarding the eddy-current field. The eddy-current field model may be transformed into another expressions. Exemplary transformation may include Laplace transformation, Z-transformation, Fourier transformation, or the like, or a combination thereof. In some embodiments of the present disclosure, the multi-exponential attenuation model may be transformed using Laplace transformation as:

$$d_m = \int_0^\infty x(k)e^{-T_m \cdot k} dk \qquad (1)$$

where $$x = \gamma \frac{G_x}{T_A} \alpha \tau (1 - e^{-T_A/\tau}),$$

k=1/τ, $d_m$ may represent eddy-current data of m, γ may represent a gyromagnetic ratio of a proton, $G_x$ may be a testing gradient, $T_A$ may represent a duration time of a falling edge of a testing gradient pulse, $T_m$ may represent a delay of the eddy-current data. As used herein, the delay may refer to a time interval between the end time of a testing gradient and the time that a corresponding eddy-current is measured or detected. The corresponding eddy-current may be generated by the testing gradient. m(m=1, 2, . . . , M) represents the sequence number of sampling timing, a may represent the amplitude of an eddy-current, and τ may represent a characteristic time of an eddy-current component (or referred to as a characteristic component described below). The eddy-current filed may include one or more eddy-current components. Each eddy-current component may correspond to a characteristic time τ. The linear part x(k) may be expressed as:

$$x = \gamma \frac{G_x}{T_A} \alpha \tau (1 - e^{-T_A/\tau}),$$

and the nonlinear part k may be expressed as: k=1/τ.

Equation (1) may indicate that $d_m$ is the Laplace transformation of x(k). In some embodiments, x(k) may be obtained by inverse Laplace transformation of $d_m$. It should be noted that, the examples shown above are merely for illustration purposes, and not intended to limit the scope of the present disclosure. In some embodiments, when the linear part and the nonlinear part of a mathematical model are independent and the expression of the mathematical model conforms to Laplace transformation, the mathematical model may also be applicable or suitable.

In step 502, data of an eddy-current field may be acquired. The measured data may be further used to calculate the calibrated eddy-current field model. In some embodiments of the present disclosure, the mathematical model determined before may contain some undetermined parameters, which need to be calculated using the measured data. Therefore, after step 502, the process may proceed to 504, when the measured data do not need further process. For example, the initial parameters of the obtained eddy-current field model may be measured directly by taking some experiments. In some embodiments, the measured data may be processed in step 503. The processing in step 503 may be performed manually by, for example, a user, or by a computation unit or a hardware. Exemplary processing applicable in step 503 may include inverse Laplace transformation, z-transformation, Fourier transformation, or the like, or a combination thereof. In step 504, the undetermined parameters of the eddy-current field model may be calculated according to the measured data of eddy-current and/or the processed measured data of eddy-current field. One or more initial parameters of the eddy-current field model may be obtained.

In step 505, a calibrated eddy-current field model may be determined according to the calculation of the undetermined parameters thereof. Details to calibrate the eddy-current field model may be disclosed elsewhere in the present disclosure.

Figure 6:
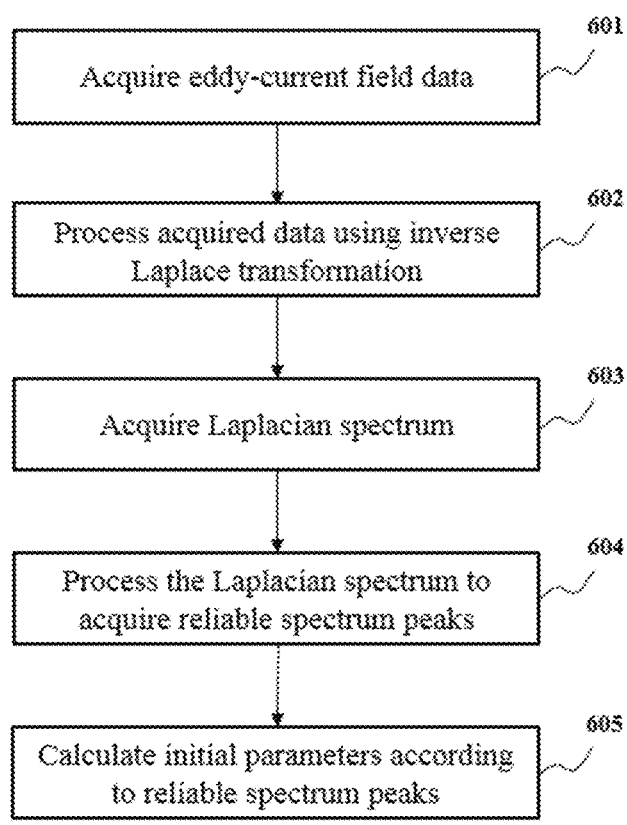
FIG. 6 is a flowchart illustrating a method of processing eddy-current field data according to some embodiments of the present disclosure.

FIG. 6 is a flowchart illustrating an exemplary method for processing eddy-current field data to obtain one or more initial parameters of an eddy-current field model according to some embodiments of the present disclosure. In step 601, a set of eddy-current field data may be acquired as described elsewhere in the present disclosure. See, for example, the description regarding step 301 in FIG. 3.

The acquired eddy-current field data may be processed in step 602. The method to process may include inverse Laplace transformation. In some embodiments, the inverse Laplace transformation may be similar to discrete Fourier transformation and realized by calculating a linear inversion. In some embodiments, the inverse radical may be discretized. In some embodiments, the discrete values of k may cover the entire or part of the range of values. The entire range may be the range of width of the corresponding Laplacian spectrum. In some embodiments, the values of k may cover one or several orders of magnitude. The values of k may be set at an equal logarithm interval. The application of the inverse Laplace transformation may acquire corresponding Laplacian spectrum. The setting of the k values may affect the acquired Laplacian spectrum. For example, if the number of the k values is too few, the number of the peaks of the Laplacian spectrum may be too few and not acceptable for further processing. If the number of the k values is too many, the subsequent processing may consume a large amount of computation resource. In some embodiments, a several dozen to several hundred of discrete k values may be acquired. Assuming that n(n=1, 2, . . . , N) represents the sequence of k, Equation (1) may be rewrote as:

$$d_m = \Sigma_{n=1}^N x_n e^{-T_m \cdot k_n}. \qquad (2)$$

Equation (2) may be expressed in the following form:

$$d = Cx, \qquad (3)$$

where both d=[$d_1, d_2, \ldots, d_m$]$^T$ and x=[$x_1, x_2, \ldots, x_n$]$^T$ may represent column vectors. Superscript T represents a transposition. C is a coefficient matrix of m rows*n columns. In some embodiments, C may be a Laplacian operator that may be defined as:

$$C_{m,n} = e^{-T_m \cdot k_n}. \qquad (4)$$

In some embodiments, Equation (3) may be underdetermined (m<n), so that the result of Equation (2) may be ill conditioned while x=C/d and/or x=C$^+$d. In some embodiments, superscript+may represent a Moore-Penrose generalized inverse. A regularization method may be used to solve the ill conditioned result. In some embodiments, the discrete values of k may be substituted into Equation (5) shown below to calculate x, and the distribution function of x relating to k may be as follows:

$$\min_x \{\|Cx - d\|_2^2 + R(x)\}, \qquad (5)$$

where R (x) may be a penalty term for supplementing a specific constraint condition. Exemplary constraint conditions may include smoothness, sparsity, or the like, or a combination thereof. For different kinds of constrain conditions, the number of eddy-current components shown in the Laplacian spectrum may be different. Merely by way of example, the number of eddy-current components is limited; a sparse constraint condition may be used. An $l_1$-norm punishment as follows is an exemplary sparse constraint condition:

$$R(x)=\lambda\|x\|_1, \qquad (6)$$

where $\lambda$ may represent a Lagrange multiplier, and/or a regularization coefficient. In some embodiments, the regularization coefficient may be used to adjust the punishment intensity. In some embodiments, the regularization coefficient may keep a balance between the regression effect and sparseness. An appropriate value of $\lambda$ may be acquired with a posterior examination strategy. Exemplary posterior examination strategies may include an L-curve method, limiting the sparseness of spectrum peaks, or the like, or a combination thereof. An $l_1$-norm punishment may provide a mandatory sparseness. In some embodiments, an $l_1$-norm punishment may be used in the construction of a sparse Laplacian spectrum of x relating to k. For example, the sparse Laplacian spectrum may be acquired using an $l_1$-norm punishment as disclosed in "Sparse MRI: The Application of Compressed sensing for Rapid MR Imaging, M. Lustig, D. Donoho, and J. M. Pauly, Magn. Reson. Med., 2007, 58, 1182," the contents of which are hereby incorporated by reference.

Figure 7:
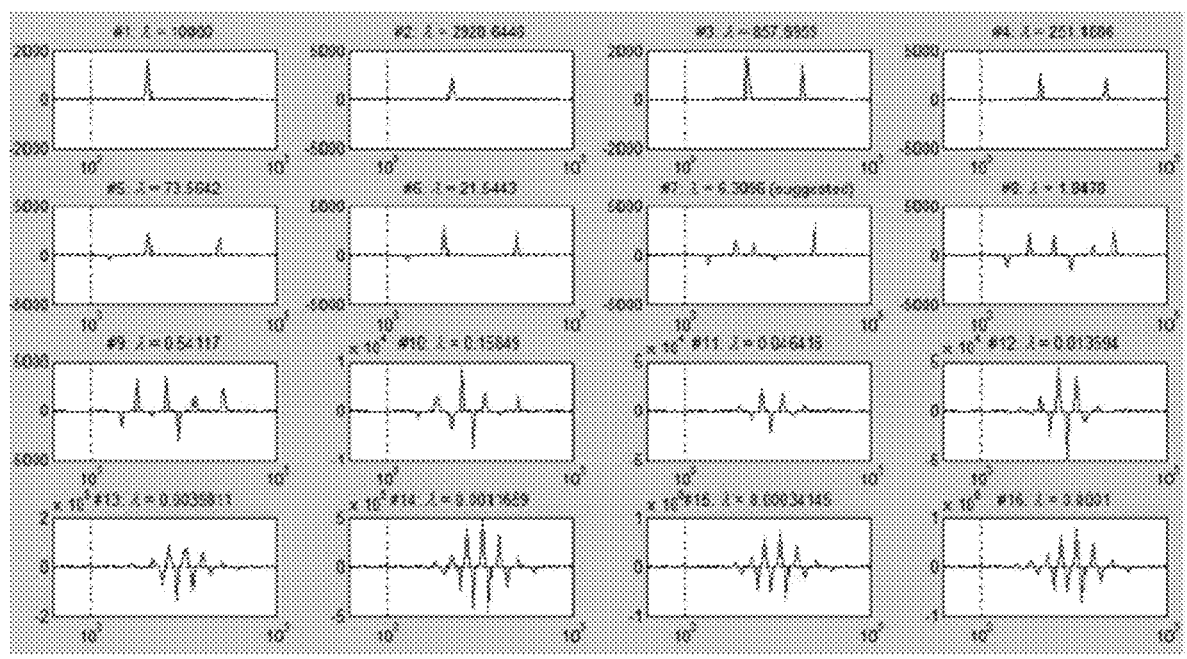
FIG. 7 is a diagram illustrating Laplacian spectrums under different intensities of punishment according to some embodiments of the present disclosure.

In step 603, a Laplacian spectrum may be acquired according to the process in step 602. FIG. 7 is a diagram illustrating various Laplacian spectrums acquired using different punishment intensities according to some embodiments of the present disclosure. For different $\lambda$, the numbers of peaks in the Laplacian spectrums may be different. For instance, when $\lambda=10,000$, the acquired Laplacian spectrum may have one peak. As the value of $\lambda$ decreases, the number of peaks of a Laplacian spectrum may increase, and the intensity of a peak of the Laplacian spectrum may increase. The acquired Laplacian spectrum may be further processed to extract relevant information. An appropriate value of $\lambda$ and an image of a corresponding Laplacian spectrum may be selected. In some embodiments, the selection may be based on knowledge from, for example, prior experience. In some embodiments, the selection may be based on the complexity of subsequent processing steps. For example, the corresponding Laplacian spectrum may be determined based on the value of peak intensity. In some embodiments, information of the peaks of a Laplacian spectrum may be extracted. Exemplary peak information may include location, intensity, or the like, or a combination thereof. The extracted information may be used to further calculate the unknown parameters of the obtained eddy-current field model. Parameters $\alpha$ and $\tau$ of the eddy-current field model may be acquired based on x and k. In some embodiments, at least some of the values of x may be non-zero. In some embodiments, the values of k may be related to the values of x. The eddy-current field model with the parameters so determined may be used in compensation for the eddy-current field. The raw data of an actual eddy-current field may include noise, and the acquired sparse Laplacian spectrum may contain pseudo-components in a small or large amount, thereby affecting the quality of an image based on the raw data. The value of a discrete inverse radical relating to a characteristic component may be within a range of the characteristic component of the eddy-current field. As used herein, the characteristic component of an eddy-current field may be at least one of the eddy-current components of the eddy-current field that may describe or characterize the eddy-current field. The acquired Laplacian spectrum may be further processed.

Referring back to FIG. 6, in step 604, one or more reliable spectrum peaks may be acquired by processing the Laplacian spectrum according to some embodiments of the present disclosure. The reliable spectrum peak may be acquired based on the intensity of a peak, or the location of a peak, or the like, of a combination thereof. In some embodiments, the reliable spectrum peak may be determined based on non-overlapping peaks. In some embodiments, the peaks overlapping may be determined not to be reliable spectrum peaks. In some embodiments, two peaks may be determined as one reliable peak. Details to acquire the reliable spectrum peaks according to some other embodiments may be found elsewhere in the present disclosure.

In step 605, initial parameters of the obtained eddy-current field model may be calculated based on the reliable spectrum peaks. The initial parameters may be one or more sets of data. In some embodiments, the data may be initial estimation data used in nonlinear least square fitting of Equation (1). In some embodiments, the initial parameters may be set as the values of x corresponding to one or more reliable peaks (or referred to as reliable spectrum peaks), and the corresponding values of k of the values of x. Details regarding the determination of the initial parameters may be found elsewhere in the present disclosure.

Figure 8:
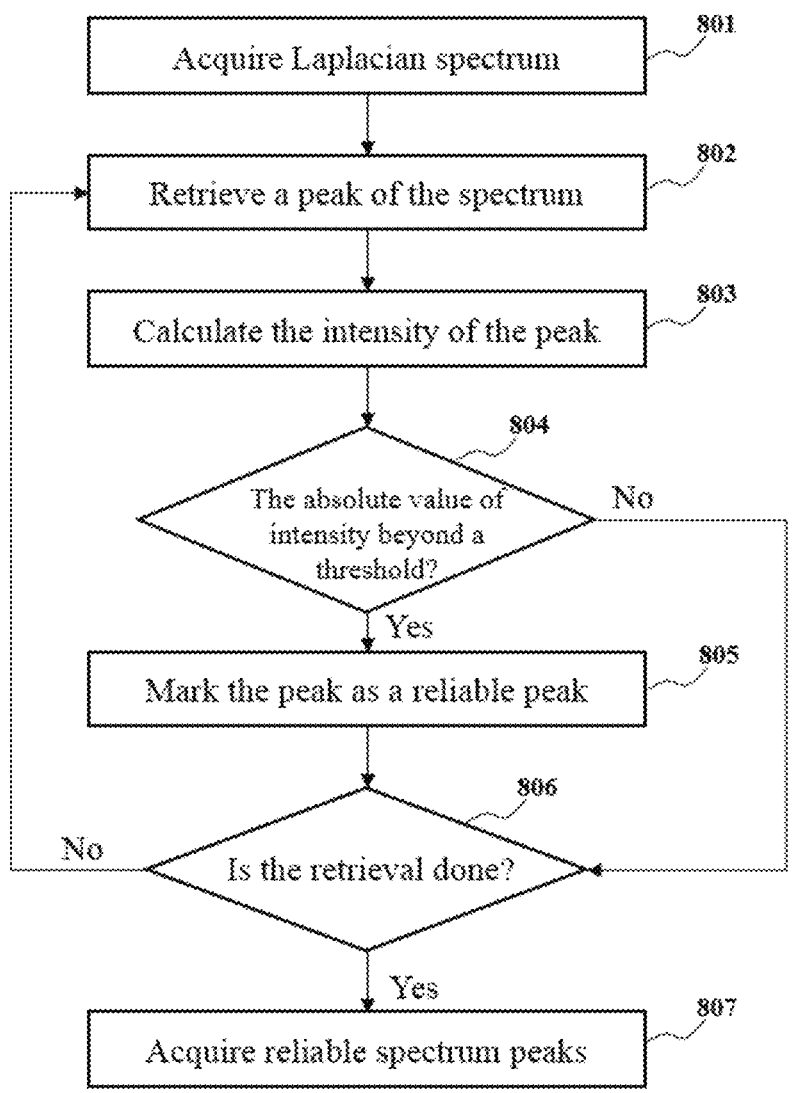
FIG. 8 is a flowchart illustrating a process for determining reliable spectrum peaks in a Laplacian spectrum according to some embodiments of the present disclosure.

FIG. 8 is a flowchart illustrating a process for determining reliable spectrum peaks in a Laplacian spectrum according to some embodiments of the present disclosure. In step 801, a Laplacian spectrum may be acquired. Information of the peaks (or referred to as peak information) may be extracted from the spectrum. Exemplary peak information may include location, intensity, or the like, or a combination thereof. Other characteristics of the peaks may be extracted and/or used in subsequent processing. In step 802, a spectrum peak may be retrieved according to at least some of the peak information. In some embodiments, the retrieval may be based on the location of each peak. For example, the peaks may be sorted and numbered by their locations. In some embodiments, the retrieval may start from the first one. In some embodiments, the retrieval may start from the last one. In some embodiments, all or some the peaks in a Laplacian spectrum may be retrieved. For example, every other peaks of a Laplacian spectrum may be retrieved.

The retrieved peaks may be analyzed in step 803. For instance, the characteristic feature of the peak may be calculated in step 803 as illustrated in FIG. 8. The characteristic feature may be the maximum intensity of a peak (also referred to as characteristic intensity), or the integral of the corresponding area underneath the intensity distribution of the peak. In step 804, an assessment may be performed to determine whether a peak is a reliable peak. In some embodiments, if the absolute value of the characteristic intensity of a peak is beyond a predetermined threshold, the peak may be considered as a reliable peak.

Figure 9:
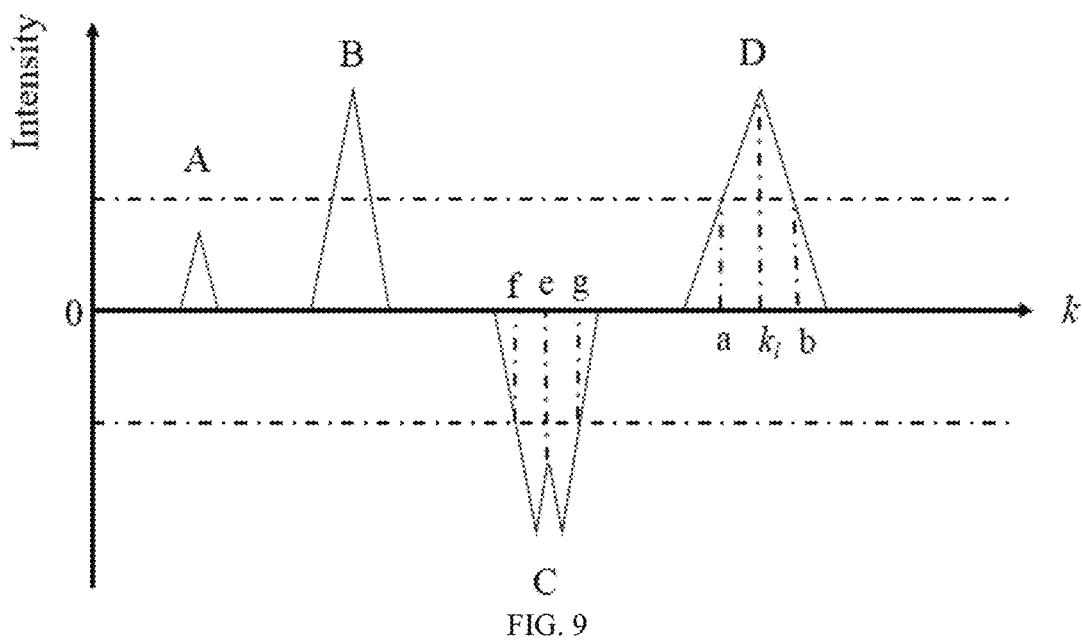
FIG. 9 is a schematic diagram illustrating a Laplacian spectrum according to some embodiments of the present disclosure.

FIG. 9 is a schematic diagram illustrating a Laplacian spectrum according to some embodiments of the present disclosure. The peak A and peak B may be representative peaks in a Laplacian spectrum. The two horizontal dash lines may represent the predetermined threshold. For example, the absolute value of characteristic intensity of the peak A is below the dash line and that of the peak B is above the dash line.

Based on the assessment of step 804, if the absolute value of the characteristic intensity beyond a threshold, the process may proceed to step 805. In step 805, the peak is satisfied the step 804 may be marked as a reliable peak. In connection with the exemplary peaks illustrated in FIG. 9, the peak B may be marked as a reliable peak, while peak A is not marked as a reliable peak in step 805. In some embodiments, if the peak is marked as a reliable peak, the information thereof may be stored in an area other different from where the information of an unreliable peak is stored. In some embodiments, the reliable peak may be assigned a label and may be used in further processing.

After the reliable peak is marked in step 805, the process may further proceed to step 806. If the peak does not satisfied the criterion of step 804, the process may proceed to step 806 without marking the peak. In some embodiments, an unreliable peak may be ignored in further processing. In step 806, another assessment may be performed to determine whether the retrieval of peaks of a spectrum for assessment in step 804 is complete. In some embodiments, the retrieval may be stopped when all the peaks in a spectrum image are retrieved for analysis. In some embodiments, only some peaks of a spectrum need to be retrieved. Merely by way of example, every other peaks of a spectrum need to be retrieved, or one every three or four peaks of a spectrum need to be retrieved. For example, after a certain percentage of peaks are retrieved, the retrieval may terminate. As another example, when a certain number of reliable peaks are marked, the retrieval may terminate. The certain number of reliable peaks may be enough for further processing. In step 807, the reliable peaks may be acquired. By this procedure as illustrated in FIG. 8, at least some of the pseudo-components caused by noise of the original data may be removed.

Figure 10:
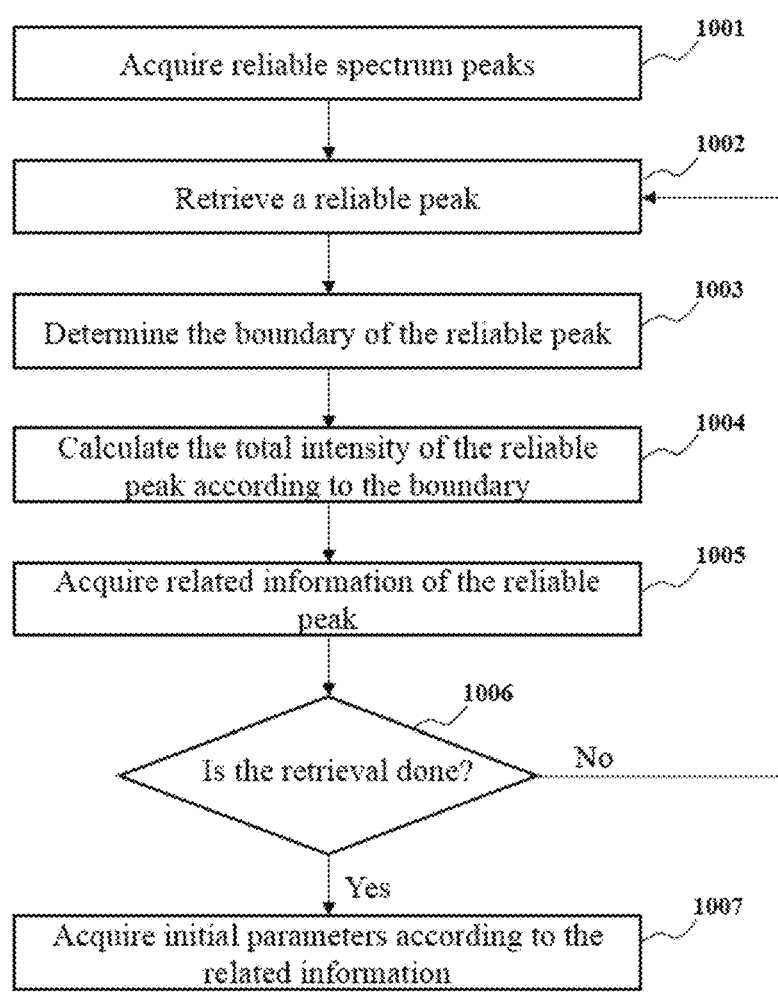
FIG. 10 is a flowchart illustrating a process for acquiring initial parameters according to some embodiments of the present disclosure.

FIG. 10 is a flowchart illustrating a process for acquiring initial parameters according to some embodiments of the present disclosure. In step 1001, a set of reliable spectrum peaks may be acquired. In some embodiments, the set of reliable spectrum peaks may be identified as described elsewhere in the disclosure. See, for example, FIG. 8 and the description thereof. In step 1002, the reliable peaks may be retrieved. In some embodiments, the retrieval may start from the first reliable peak to the last one based on the marked or numbered reliable peaks. In some embodiments, a different order of the retrieval may be employed.

In step 1003, the boundary of the retrieved reliable peak in step 1002 may be determined. The boundary of a reliable peak may be used to calculate the total intensity of the spectrum peak. Referring to FIG. 9, the vertical dash lines a and b may be the boundaries of the peak D.

Based on the boundaries of a reliable peak, a specific area may be determined in step 1004. The specific area may represent the total intensity of the reliable peak. For example, the total intensity may be set as the integral value of the specific area. In some embodiments, the total intensity of a peak may be set as the integral value of the specific area defined by the intensity distribution of a reliable peak, the boundaries of the reliable peak, and the threshold intensity (e.g., indicated by the dashed lines in FIG. 9). In step 1005, information including the total intensity of the reliable peak may be acquired. In step 1006, an assessment may be performed for determining whether the retrieval of reliable peaks are completed. In some embodiments, the retrieval may terminate when all the reliable peaks are retrieved. Based on the assessment, if the retrieval is complete, the process may proceed to step 1007. Otherwise, the process may proceed to step 1002 to retrieve more reliable peaks.

In step 1007, the initial parameters may be determined according to at least some of the peak information of the reliable peaks. In some embodiments, the values of k relating to the maximum values of x may be acquired. For example, for a reliable peak l, the value of $k_l$ corresponding to the maximum value of $x_l$ may be set as $k0_l$, and the total intensity as $x0_l$. The peak information including the values of $x0_l$ and $k0_l$ corresponding to the reliable peak l or a plurality of the reliable peaks may be acquired to provide the sets of $[x0_l]$ and $[k0_l]$. The initial parameters may be set as $[x0_l]$ and $[k0_l]$.

Figure 11:
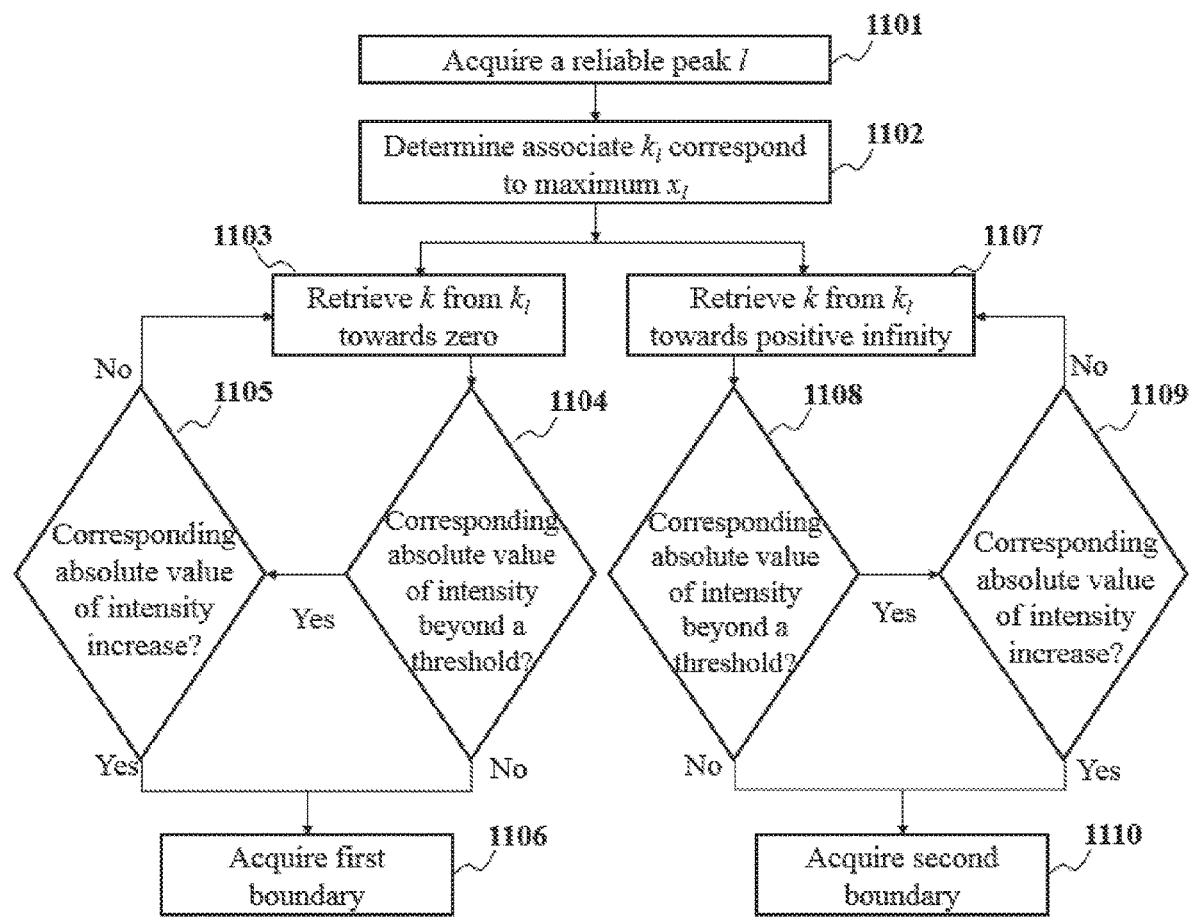
FIG. 11 is a flowchart illustrating a process for determining the boundary of a reliable peak according to some embodiments of the present disclosure.

FIG. 11 is a flowchart illustrating a process for determining the boundary of a reliable peak according to some embodiments of the present disclosure. In step 1101, a reliable peak may be acquired. In some embodiments, the reliable peak may be numbered with a designation l. In step 1102, the value of $k_l$ corresponding to the characteristic intensity may be determined. As another example shown in FIG. 9, the position of $k_l$ may be determined based on the vertical dash line e in the middle of the peak D. After the position of $k_l$ is determined, the process may proceed to step 1103 and/or 1107.

In step 1103, the retrieval may start form $k_l$ towards the direction of zero. For a given k, the corresponding absolute value of intensity may be determined. In step 1104, an assessment may be performed to determine whether the absolute value of the intensity is equal to or exceeds a threshold. If the absolute value of the intensity falls below the threshold, the process may proceed to step 1106, and the first boundary may be determined. For example, referring to FIG. 9, the peak D may be a reliable peak according to some embodiments of the present disclosure. In FIG. 9, the retrieval may start from $k_l$. $k_l$ may be denoted by the dash line in the middle of the peak D. As the retrieval start from $k_l$ towards the direction of zero, in step 1104, the retrieval may terminate at the point of α (set as left boundary $klb_j$). In another word, the dash line at the point α is the first boundary of the peak D. It should be noted that the threshold used to determine the boundary may be the same as that used in the determination of reliable peak. In some embodiments, the threshold used to determine the boundary may be different from which used in the determination of reliable peak. For example, the threshold may be a value relating to the area located within the boundary beyond a certain percent of the area of the peak.

In step 1104, if the absolute value of the intensity exceeds the threshold, a further assessment may be performed to determine if the specific reliable peak overlaps with another reliable peak. In step 1105, the absolute value of the intensity at a k value may be compared with the absolute value of the intensity at a preceding k value in the preceding retrieval. In some embodiments, the retrieval may start from the maximum intensity of a reliable peak (e.g., the characteristic intensity of the peak), and the absolute value of the intensity corresponding to the k values may decrease for the intensities retrieved subsequently. If the absolute value of the intensity increase, there may be two or more overlapping reliable peaks. If the corresponding absolute value of intensity exceeds the threshold and larger than the previous one in the last retrieval, the retrieval may terminate and the first boundary may be determined. Otherwise, the assessment may proceed to step 1103 for next retrieval. For example, as is shown in FIG. 9, the peak C may include two overlapped peaks. The dash line at the point e may be the first boundary of the peak on the right side of the peak C, and the dash line at the point f may be the first boundary of the peak on the left side of the peak C according to the assessment of step 1104 and step 1105.

In some embodiments, the retrieval may start form $k_l$ towards the direction of the positive infinity. For example, according to the right branch of the process in FIG. 11, the second boundary of a reliable peak may be determined following the same steps as in the determination of the first boundary. As another example, in FIG. 9, the dash line at point b (set as right boundary $kub_l$) may be the second boundary of the peak D, and the dash line at point e may be the second boundary of the peak on the left side of the overlapping peak C, and the dash line at the point g may be the second boundary of the peak on the right side of the peak C.

Referring back to step 505, after the initial parameters are determined, the eddy-current field may be calibrated. In some embodiments, the values of the unknown parameters may cover a range of one or several orders of magnitude. For instance, to various eddy-current components (e.g., those illustrated in FIG. 13), the values of k may cover one or several orders of magnitude. The determination of the unknown parameters may be difficult using an unconstrained optimization.

In some embodiments, the value range of $k_l$ may be determined by the two boundaries of a spectrum peak in the sparse Laplacian spectrum of x relating to k, and the corresponding total intensity $x0_l$ may be close to the true value of $x_l$. In some embodiments, The boundary of $x_l$ may be set as $xlb_l=\mu \cdot x0_l$ and $xub_l=v \cdot x0_l$. If $x0_1>0$, then $0<\mu<1$ and $1<v<+\infty$, and if $x0_1<0$, then $1<\mu<+\infty$ and $0<v<1$. Merely by way of example, the boundaries of $x_l$ may be calculated by setting $\mu=0.5$ and $v=2(x0_1>0)$, or setting $\mu=2$ and $v=0.5$ ($x0_1<0$). By applying the above steps, the unknown parameters may fall within a range. In some embodiments, an appropriate selection of the initial parameters of the eddy-current field model may facilitate a global optimization. In some embodiments, an appropriate selection of the initial parameters may facilitate a local optimization. In some embodiments, an appropriate selection of the initial parameters may facilitate a local optimization and a global optimization, and the optimization may be more robust. As used herein, a global optimization may indicate that a set of parameters of the eddy-current field model provides a best solution of an objective function (e.g., a minimized value of the objective function) in an entire parametric space. As used herein, a local optimization may indicate that a set of parameters of the eddy-current field model provides a best solution of an objective function (e.g., a minimized value of the objective function) in a subset of the entire parametric space.

According to Equation (2), the estimation of the unknown parameters of the eddy-current field model may be calculated by the following equation:

$$\min_{x,k}\left\{\sum_{m=1}^{M}\left(d_m - \sum_{l=1}^{L} x_l e^{-T_m \cdot k_l}\right)^2\right\}, \quad (7)$$

where $$x_l = \gamma \frac{G_X}{T_A} \alpha_l \tau_l (1 - e^{-T_A/\tau_l}),$$

$k_l=1/\tau_l$, $d_m$ is a eddy-current data of m, $\gamma$ is the gyromagnetic ratio of proton, $G_x$ is a testing gradient of the magnetic field, $T_A$ is the duration of the falling edge of the testing gradient, and $T_m$ is the $d_m$ delay time of sampling the eddy-current data. $m(m=1, 2, \ldots, M)$ represents the sequence number of sampling timing, $l(l=1, 2, \ldots, L)$ represents the sequence number of the eddy-current component, $\alpha_l$ represents the amplitude of the eddy-current component l, and $\tau_l$ represents the a characteristic time of an eddy-current component l. A testing gradient may be provide to determine an eddy-current that may be generated in response.

In some embodiments, the veracity of the compensation method may be improved. For example, the improvement may be performed by utilizing a bilateral linear inequality constrain to the eddy-current field model based on the peak information of the acquired reliable spectrum peaks. In some embodiments, the bilateral linear inequality constraint may be achieved using an interior point method. For example a logarithm barrier function may be added to the original objective function as a penalty term. The updated objective function may be defined as $$\min_{\substack{xlb_l<x_l<xub_l \\ klb_l<k_l<kub_l}}\left\{\sum_{m=1}^{M}\left(d_m - \sum_{l=1}^{L} x_l e^{-T_m \cdot k_l}\right)^2 + P(x,k)\right\}, \quad (8)$$

where the penalty term P(x,k) may be defined as:

$$P(x,k)=-\beta \cdot \Sigma_{l=1}^{L}[\log(x_l-xlb_l)+\log(xub_l-x_l)+\log(k_l-klb_l)+\log(kub_l-k_l)]. \quad (9)$$

In Equation (9), β may denote the Lagrange's multiplier, and its value may be determined by a minimum residual error. For example, the method may be achieved by a numerical method described in "Numerical Recipes, W. H. Press, B. P. Flannery, S. A. Teukolsky, W. T. Vetterling, Cambridge University Press, New York, 1988," the contents of which are hereby incorporated by reference.

The values of x and k may be calculated via the constrained optimization disclosed elsewhere in the present disclosure. The unknown parameter τ of the eddy-current field model may be obtained by calculating the reciprocal of k. As mentioned above, the undetermined parameter a may be calculated according to x and τ. Both of the unknown parameters of the eddy-current field model may be calculated. A calibrated eddy-current field model may be obtained according to α and τ, and further used in future eddy-current field compensation. When an MRI scanner is used in an operation, the operation parameters may be the same as during a test in which a calibrated eddy-current field model is determined. The eddy-current field during the operation may be essentially the same as an eddy-current field during the test. As used herein, "essentially," as in "essentially the same," etc., with respect to a parameter or a feature may indicate that the variation is within 2%, or 5%, or 8%, or 10%, or 15%, or 20% of the parameter or the feature. The eddy-current field during the operation may be compensated based on the corresponding calibrated eddy-current field model. In some embodiments, at least one characteristic component of the eddy-current field may be identified based on the calibrated eddy-current field model. An eddy-current field that includes or may be described by the characteristic component may be compensated based on the at least one characteristic component of the eddy-current field. In some embodiments, a plurality of characteristic components of the eddy-current field may be identified based on the calibrated eddy-current field model. An eddy-current field that includes or may be described by the plurality of characteristic components may be compensated based on the plurality of characteristic components.

Figure 12:
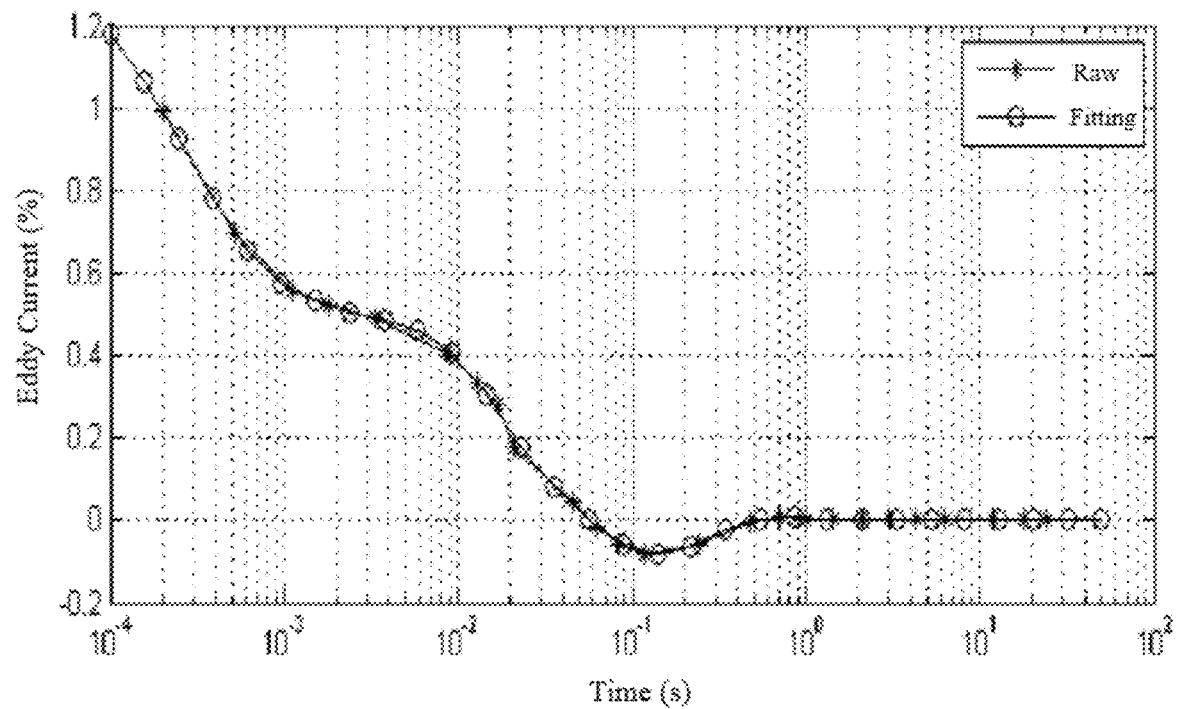
FIG. 12 is a diagram depicting a curve of raw eddy-current and a curve of fitting eddy-current according to some embodiments of the present disclosure.

FIG. 12 depicts a curve of raw eddy-current and a curve of fitting eddy-current according to some embodiments of the present disclosure. The curve of raw eddy-current was obtained by measuring an actual eddy-current field. The raw data are illustrated as stars connected by a curve. The curve fitting of the raw eddy-current was obtained based on a calibrated compensation model obtained according to the system and method disclosed herein. As shown in FIG. 12, the curve based on the calibrated compensation model may provide a close approximation of the raw (or actual) eddy-current field.

Figure 13:
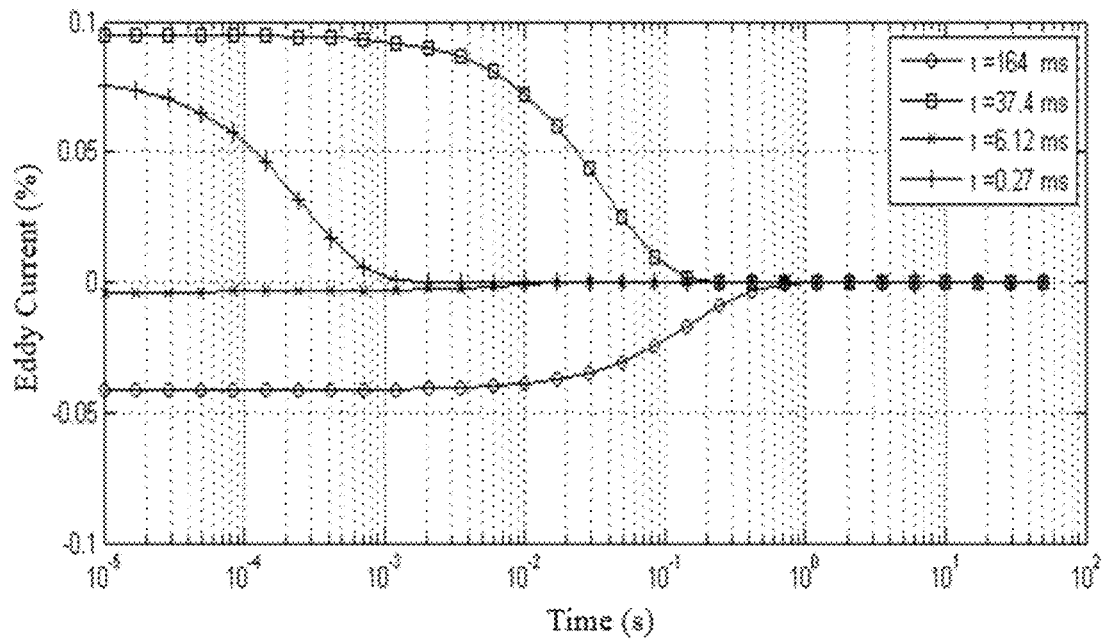
FIG. 13 is a diagram depicting curves that fit eddy-current of different ingredients according to some embodiments of the present disclosure.

FIG. 13 depicts curve fitting of different components of an actual eddy-current field according to some embodiments of the present disclosure. In some embodiments, the curves of the different components may be added together to obtain the curve of the eddy-current based on the calibrated compensation model as illustrated in FIG. 12. The curve with the circles was for the component of i=164 microseconds. The curve with the squares was for the component of τ=37.4 microseconds. The curve with the crosses was for the component of τ=6.12 microseconds. The curve with the bars was for the component of τ=0.27 microseconds.

It should be noted that the above description of the three embodiments are provided for a purpose of comprehending the present disclosure, not intended to limit the scope of the present disclosure. For persons having ordinary skills in the art, various variations and modification may be conducted in the light of the present disclosure. However, the variations and the modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "block," "module," "engine," "unit," "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities of ingredients, properties such as molecular weight, reaction conditions, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system, comprising:
   at least one storage device storing executable instructions, and
   at least one processor in communication with the at least one storage device, when executing the executable instructions, causing the system to perform operations including:
      obtaining eddy-current data of an eddy-current field;
      performing a transformation operation on the eddy-current data of the eddy-current field to obtain transformed eddy-current data of the eddy-current field;
      determining, based on the transformed eddy-current data, one or more initial values of one or more eddy-current parameters of an eddy-current field model;
      determining, based on the one or more initial values of the one or more eddy-current parameters, one or more target values of the one or more eddy-current parameters; and
      calibrating the eddy-current field based on the eddy-current field model with the one or more target values of the one or more eddy-current parameters.

2. The system of claim 1, wherein the transform operation includes an inverse Laplace transformation and the transformed data of the eddy-current field includes a Laplacian spectrum.

3. The system of claim 1, wherein to determine, based on the transformed eddy-current data, one or more initial values of one or more eddy-current parameters of an eddy-current field model, the at least one processor causes the system to perform additional operations including:
   determining, based on the transformed eddy-current data, one or more initial values of one or more first parameters associated with the transformed eddy-current data, each of the one or more first parameters corresponding to one of the one or more eddy-current parameters associated with the eddy-current data; and
   determining, based on the initial values of the one or more first parameters, the initial values of the one or more eddy-current parameters.

4. The system of claim 3, wherein to determine, based on the transformed data of the eddy-current field, one or more initial values of one or more first parameters associated with the transformed eddy-current data, the at least one processor causes the system to perform the operations including:
   acquiring information of a peak of the Laplacian spectrum; and
   determining the one or more initial values of the one or more first parameters based on the information of the peak.

5. The system of claim 4, wherein the information of the peak comprises at least one type of position, boundary, or intensity.

6. The system of claim 4, wherein to acquire information of a peak of the Laplacian spectrum, the at least one processor causes the system to perform the operations including:
   obtaining a first threshold;
   comparing the absolute value of an intensity of the peak with the first threshold; and
   marking, if the absolute value of the intensity of the peak exceeds the first threshold, the peak as a reliable spectrum peak.

7. The system of claim 4, wherein the peak comprises a reliable spectrum peak, and to determine the one or more initial values of the one or more first parameters based on the information of the peak, the at least one processor causes the system to perform the operations including:
   determining a boundary of the reliable spectrum peak;
   calculating a total intensity of the reliable spectrum peak within the boundary; and
   setting the one or more initial values of the one or more first parameter based on the total intensity of the reliable spectrum peak.

8. The system of claim 3, wherein to determine, based on the initial values of the one or more first parameters, the initial values of the one or more eddy-current parameters, the at least one processor causes the system to perform the operations including:
   obtaining a relationship between a value of each of the one or more first parameters and a value of at least one of the one or more eddy-current parameters; and
   determining, based on the initial values of the one or more first parameters and the relationship, the initial values of the one or more eddy-current parameters, wherein the one or more eddy-current parameters include an amplitude and a characteristic time of each of one or more eddy-current components included in the eddy-current field.

9. The system of claim 8, wherein the relationship is determined based on a transformation of the eddy-current field model.

10. The system of claim 1, wherein to determine, based on the one or more initial values of the one or more eddy-current parameters, one or more target values of the one or more eddy-current parameters, the at least one processor causes the system to perform the operations including:
   determining, based on the one or more initial values of the one or more eddy-current parameters, the one or more target values of the one or more eddy-current parameters using a least square algorithm.

11. The system of claim 10, wherein to determine, based on the one or more initial values of the one or more eddy-current parameters, the one or more target values of the one or more eddy-current parameters using the least square algorithm, the at least one processor causes the system to perform the operations including:
   obtaining an objective function associated with the one or more eddy-current parameters, the objective function denoting a difference between the eddy-current data and an estimated eddy-current data determined based on the one or more target values of the one or more eddy-current parameters; and
   determining, based on the objective function and the one or more initial values of the one or more eddy-current parameters using the least square algorithm, the one or more target values of the one or more eddy-current parameters.

12. A system, comprising:
   at least one storage device storing executable instructions, and
   at least one processor in communication with the at least one storage device, when executing the executable instructions, causing the system to perform operations including:
      obtaining eddy-current data of an eddy-current field;
      performing a transformation operation on the eddy-current data of the eddy-current field to obtain transformed eddy-current data of the eddy-current field;
      determining, based on the transformed eddy-current data of the eddy-current field, one or more target values of one or more first parameters associated with the transformed eddy-current data;
      determining, based on the one or more target values of the one or more first parameters, one or more target values of one or more second parameters of the eddy-current data, wherein the one or more second parameters correspond to the one or more first parameters and include one or more eddy-current parameters;
      determining an eddy-current field model including the one or more target values of the one or more second parameters; and
      calibrating the eddy-current data based on the eddy-current field model.

13. The system of claim 12, wherein to determine, based on the transformed eddy-current data of the eddy-current field, one or more target values of one or more first parameters associated with the transformed eddy-current data, the at least one processor causes the system to perform the operations including:
   establishing an objective function associated with the one or more first parameters associated with the transformed eddy-current data of the eddy-current field, the objective function denoting a difference between the eddy-current data and an estimated eddy-current data determined based on the one or more target values of the one or more first parameters; and
   determining, based on the objective function and the transformed eddy-current data, the one or more target values of the one or more first parameters.

14. The system of claim 13, wherein to determine, based on the objective function and the transformed eddy-current data, the one or more first parameters, the at least one processor causes the system to perform the operations including:
   determining, based on the transformed eddy-current data, one or more initial values of the one or more first parameters associated with the transformed eddy-current data; and
   determining, based on the objective function and the initial values of the one or more first parameters, the one or more target values of the one or more first parameters.

15. The system of claim 14, wherein the transform operation includes an inverse Laplace transformation and the transformed data of the eddy-current field includes a Laplacian spectrum.

16. The system of claim 15, wherein to determine, based on the transformed data of the eddy-current field, one or more initial values of the one or more first parameters associated with the transformed eddy-current data, the at least one processor causes the system to perform the operations including:
   acquiring information of a peak of the Laplacian spectrum; and
   determining the one or more initial values of the one or more first parameters based on the information of the peak.

17. The system of claim 16, wherein the objective function includes a penalty term constructed based on one or more logarithmic functions associated with the one or more firsts parameters.

18. The system of claim 12, wherein to determine, based on the one or more target values of the one or more first parameters, one or more target values of the one or more second parameters of the eddy-current data, the at least one processor causes the system to perform the operations including:
   obtaining a relationship between a value of each of the one or more first parameters and a value of at least one of the one or more eddy-current parameters; and
   determining, based on the initial values of the one or more first parameters and the relationship, the initial values of the eddy-current parameters, wherein the eddy-current parameters includes an amplitude and a characteristic time of each of one or more eddy-current components included in the eddy-current field.

19. The system of claim 18, wherein the relationship is determined based on the transform operation on the eddy-current field model.

20. A method implemented on a computing device having at least one processor and at least one storage device, the method comprising:
   obtaining eddy-current data of an eddy-current field;
   performing a transformation operation on the eddy-current data of the eddy-current field to obtain transformed eddy-current data of the eddy-current field;

determining, based on the transformed eddy-current data, one or more initial values of one or more eddy-current parameters of an eddy-current field model;

determining, based on the one or more initial values of the one or more eddy-current parameters, one or more target values of the one or more eddy-current parameters; and calibrating the eddy-current field based on the eddy-current field model with the one or more target values of the one or more eddy-current parameters.

* * * * *